United States Patent [19]
Kato et al.

[11] Patent Number: 5,424,573
[45] Date of Patent: Jun. 13, 1995

[54] SEMICONDUCTOR PACKAGE HAVING OPTICAL INTERCONNECTION ACCESS

[75] Inventors: Takeshi Kato; Katsuya Tanaka, both of Kokubunji; Kenichi Mizuishi, Hachioji, all of Japan

[73] Assignee: Hitachi, Ltd., Tokyo, Japan

[21] Appl. No.: 26,037

[22] Filed: Mar. 4, 1993

[30] Foreign Application Priority Data

Mar. 4, 1992 [JP] Japan ................................ 4-046682

[51] Int. Cl.⁶ .................. H01L 29/161; H01L 29/205; H01L 29/225; H01L 33/00
[52] U.S. Cl. ........................................ 257/431; 257/79; 257/80; 257/81; 257/82; 257/116; 257/117; 257/432; 257/433
[58] Field of Search ....................... 257/79, 80, 81, 82, 257/84, 98, 99, 100, 116, 117, 118, 431, 432, 433, 532, 622, 762, 763, 773, 777, 778

[56] References Cited

U.S. PATENT DOCUMENTS

| 4,820,013 | 4/1989 | Fuse ................................ 257/98 |
| 5,047,835 | 9/1991 | Chang ............................ 257/433 |

FOREIGN PATENT DOCUMENTS 62-73651  4/1987  Japan .
63-502315 9/1988  Japan .
63-237486 10/1988 Japan .
64-30274  2/1989  Japan .

OTHER PUBLICATIONS

"41th Electronic Components & Technology Conference" (1991), pp. 234–244.
"Bear Chip Mounting using COB and TAB-Recent Technology Development and means for Improving Reliability (1990)", pp. 285–287.

Primary Examiner—Prenty, Mark V.
Assistant Examiner—Carl Whitehead, Jr.
Attorney, Agent, or Firm—Fay, Sharpe, Beall, Fagan, Minnich & McKee

[57] ABSTRACT

A semiconductor package includes a semiconductor chip, an interconnection substrate having the semiconductor chip mounted on one surface of the interconnection substrate, and a package base having the interconnection substrate mounted on one surface of the package base. An optical transmission medium is provided on the package base at a location corresponding to an optical device provided on the interconnection substrate. On the other surface of the package base is provided a receptacle for making an optical connection between an optical fiber cable and the optical transmission medium. Signals are input and/or output via the optical fiber cable connected to the receptacle.

15 Claims, 7 Drawing Sheets

SEMICONDUCTOR PACKAGE HAVING OPTICAL INTERCONNECTION ACCESS

BACKGROUND OF THE INVENTION

The present invention relates to a semiconductor package and semiconductor module and, more specifically, to a semiconductor package and semiconductor module wherein optical interconnection technology is applied for input/output of signals.

In recent years, as the integration density and operation speed of semiconductor chips increase, higher densities are required for mounting and interconnection for semiconductor packages.

One known way to achieve such requirements, as disclosed for example in Japanese Unexamined Patent Publication No.62-73651, is to use a technology called silicon-on-silicon packaging in which semiconductor chips are mounted by flip-chip bonding on a wiring substrate made of a semiconductor wafer. In this mounting technology, high-density interconnections can be formed on the wiring substrate by a process similar to that which is used for forming interconnections on semiconductor chips, thus resulting in a higher assembling density than in the case where semiconductor chips are separately mounted in individual packages. Furthermore, a high density of interconnection also results from another feature of this technology that semiconductor chips are connected to the wiring substrate via solder bumps.

However, the above technology has a limitation in the number of input/output pins available for a package base. Input/output pins of a wiring substrate are connected to a package base by means of wire bonding or TAB (tape-automated bonding) performed in a peripheral region of the wiring substrate, or by means of a feedthrough formed to extend through the wiring substrate. As a result, the number of input/output pins available for a package base is limited by pitches of the bonding and input/output pins themselves.

As described on pages 285-287 of "Bear Chip Mounting using COB and TAB-Recent Technology Development and Means for Improving Reliability-(1990)" published by Gijutsu Joho Kyokai (Association for Technical Information), the pitches of bonding wires and TAB are limited by the reliability of bonding portions. The possible minimum pitches are approximately 150 $\mu$m and 80 $\mu$m for wire bonding and TAB, respectively. Furthermore, because connections using wire bonding or TAB are performed in a peripheral region of a wiring substrate, it is difficult to obtain a short length of signal interconnection. This, in turn, results in a problem that there is a large delay for signals to propagate from chips to the peripheral region of the wiring substrate where bonding wires or TAB leads are connected to the substrate.

On the other hand, feedthroughs are formed in a wiring substrate by thermo-migration or anisotropic etching, as described, for example, in Japanese Unexamined Patent Publication No.62-73651. The pitch of feedthroughs is limited depending on the thickness of a wiring substrate. In the case of feedthroughs, a pitch of a few hundred $\mu$m is available. However, for electrical insulation between feedthroughs, additional insulating films are needed, or a special voltage supply is required. For this reason, this technology is not in common use yet.

As described, for example, in Proceedings of 41th Electronic Components & Technology Conference (1991), pp. 234-244, the pitch of input/output pins on a package base is limited by structure and electrical characteristics of the pins on the package base and of connectors formed on a wiring substrate. For example, a special spring mechanism is required in connectors formed on a wiring substrate so as to contact pins with connectors, and a special mechanism is required so as to reduce the force needed for inserting pins. Thus, serious mechanical limitations exist in reduction in the size of pins or connectors. On the other hand, if the pin pitch is reduced too much, an increase will occur in crosstalk or in inductance. Thus, there are electrical limitations especially in applications where high speed signals are input or output. Due to the above problems, the lower limitation of input/output pitches is about 2 mm for the case of centered lattice arrangement.

In the reference cited above, it is proposed to use spring type connectors having a special form or connectors similar to TAB structure instead of input/output pins. In the case of connectors of such a spring type, it is possible to make pitches as small as 1 mm. However, high mechanical strength and high reliability comparable to those of conventional input/output pins have not been established yet. Therefore, this type of connector is not in common use yet. In the case of the TAB type connector, interconnection is also performed from the peripheral region of a package base to the outside as in the conventional TAB and, thus, there exists a problem of large signal propagation delay across the package base.

To increase the number of input/output pins is one of the important issues for semiconductor packages. Especially in order to construct a large scale information processing system with a large number of high-assembly-density packages, it is required to make interconnections among these packages by a large number of wires.

Let us take as an example a silicon-on-silicon package having several instruction processor chips and a system control circuit chip mounted on it. When N packages of this kind are used for constructing a multi-processor system, an interconnection network among N semiconductor packages (that is, among system control circuit chips) is a key which will determine the system performance. In order to achieve the highest performance, a perfect interconnection network is desirable. Because the number of interconnection wires in a perfect interconnection network is proportional to N(N−1), a huge number of interconnection wires would be required to realize such a system. For example, when N is equal to 8 and, furthermore, if 64-byte connection is assumed, then the total number of interconnection wires will be as large as 57,000, which implies that about 7,000 input/output pins will be required for each package. If we can assume that a reasonable package size is of the order of a few inches square, then the maximum possible number of input/output pins is limited by various problems described above, and is about a few thousand. Therefore, the conventional technology cannot realize a perfect connection network which is ideal for such a system.

We discussed above an example of a multiprocessor system. When the conventional technology is used in other information processing systems such as a super parallel processor or a large scale exchange system, there are also similar problems. That is, the performance of these systems is limited by the limitation of the number of input/output pins of semiconductor packages.

Optical interconnection is regarded as one of the promising technologies for solving the above bottleneck with regard to input/output pins. In general, it is considered that the optical interconnection technology provides various advantages over the conventional electrical interconnection, that is, it is quite free from crosstalk, ground noise, and signal wave degradation. Furthermore, it can provide high speed and broad band transmission. These advantages lead to higher density of interconnection compared with the conventional electrical technology. For example, Japanese Unexamined Patent Publication No.63-502315 discloses one such optical technology, in which semiconductor chips and optical devices are mounted on stacked wafers and interconnection between different wafers is achieved by light passing through wafers.

However, in this technology, nothing is taken into consideration about a way for supplying electrical power to semiconductor wafers, about relationships with regard to location between a semiconductor wafer and optical devices, about cooling means in a package for cooling semiconductor chips, and about an input/output means for optical signals from or to a package. Therefore, the conventional optical interconnection cannot be simply applied as a means to solve the bottleneck with regard to input/output pins of semiconductor packages.

When optical devices are mounted by flip-chip bonding on a semiconductor wafer, the flip-chip bonding leads to a reduction in the density of semiconductor chips on a semiconductor wafer because of the area for optical devices. On the other hand, there is a serious difficulty in a process to form optical devices monolithically on a semiconductor wafer. Besides, because of the difference in thermal expansion coefficient between optical devices and a semiconductor wafer, degradation often occurs in optical devices. Furthermore, because a high speed and/or very large scale semiconductor chip generates a large amount of heat, a package must be provided with some cooling means on its lid as described in Japanese Unexamined Patent Publication No.62-73651. When optical signals are input or output through side faces of the package, additional space around the package is needed for optical inputs and outputs so as to avoid obstruction to effective cooling, as described for example in Japanese Unexamined Patent Publication No.63-237486. This, in turn, leads to another problem of a reduction in assembly density of packages mounted on a circuit board. If these facts are considered, it is desirable to realize optical means for signal input and output through a package base.

One known technology for input/output of optical signals performed via a package base is an optical package as described in Japanese Unexamined Patent Publication No.64-30274. In this technology, optical fibers are fixed into through-holes formed in a package base, and optical devices are mounted by flip-chip bonding on the locations facing to the end surfaces of optical fibers. However, this technology cannot be applied directly to semiconductor packages because of the lack of enough consideration on the location of optical devices, treatment of optical fibers, and cooling of optical devices. When optical devices as well as semiconductor chips are mounted by flip-chip bonding on a wiring substrate, a problem occurs that the assembly density of semiconductor chips decreases. Besides, because optical fibers are always fixed to the package base, an inconvenience occurs in treatment of optical fibers or in insertion and/or removal of input/output pins. Furthermore, because optical devices for high speed transmission such as semiconductor lasers exhibit strong dependence on temperature, adequate cooling is required.

As described above, in order to apply optical interconnection technology to high speed and/or high density semiconductor packages, overall consideration should be given not only to input/output means for optical signals from and to packages, but also to assembly density of semiconductor chips, arrangement of optical devices, cooling means for semiconductor chips and optical devices, assembly density of packages on a circuit board, and treatment of input/output pins and optical fibers.

SUMMARY OF THE INVENTION

In total view of the above, it is an object of the present invention to provide means which achieves practical application of optical interconnection technology to high speed and/or high density semiconductor packages so as to solve the bottleneck with regard to input/output pins in high speed and/or high density semiconductor packages.

It is another object of the present invention to provide optical interconnection means for performing an optical interconnection between the outside and inside of a semiconductor module as well as internal optical interconnections within a semiconductor module comprising semiconductor packages using optical interconnection technology, which are mounted on a circuit board.

In order to achieve the above objects, the present invention provides a semiconductor package comprising a semiconductor chip; an interconnection substrate supporting the semiconductor chip on its first surface; an optical device disposed in a portion of the interconnection substrate so that the optical device can perform input and output of optical signals via a second surface of the interconnection substrate in a direction substantially perpendicular to the second surface; a package base supporting the interconnection substrate on a first surface of the package base and having an optical transmission medium disposed at a location corresponding to the optical device; and a receptacle for receiving an optical fiber cable, formed on a second surface of the package base so that the receptacle makes an optical connection between the optical transmission medium and the optical fiber cable. Preferably, the optical device is disposed in a through-hole or a recess formed in the interconnection substrate so that an electrical interconnection layer can be commonly formed on the surfaces of both the interconnection substrate and the optical device.

In this way, signal input and output are achieved to and from semiconductor packages by means of optical signals without reducing the assembly density of semiconductor chips. Because the optical device has an electrical interconnection layer which is also commonly formed on the interconnection substrate, semiconductor chips and the optical device can be disposed adjacent each other, so that a reduction is achieved in propagation delay of the interconnection between the optical device and semiconductor chips. Furthermore, because the optical device and the interconnection substrate are formed in a hybrid form, it is possible to avoid the difficulty in fabrication processes and the problem of degradation of optical devices due to the difference in thermal expansion coefficient between component materials, which are encountered in the case where they are formed in a monolithic form. It is also possible to arrange optical fiber cable, which is connected to achieve input and output of optical signals, in such a manner that the optical fiber cable extends from the bottom face of a package base. As a result, semiconductor chips can be cooled by cooling means provided on a lid of a package. Furthermore, unlike the case where input and output of optical signals are performed through side faces of a package, reduction does not occur in assembly density of packages mounted on a circuit board.

DESCRIPTION OF THE PREFERRED EMBODIMENTS

Figure 1:
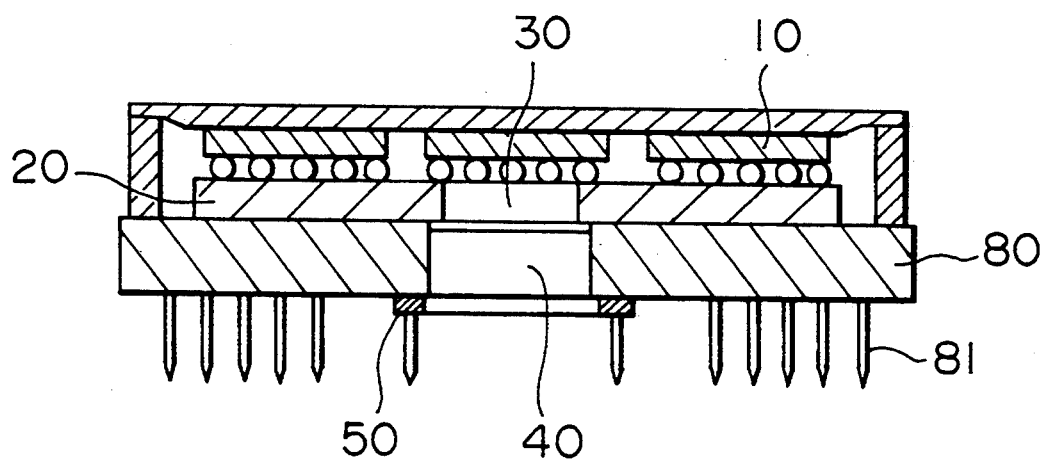
FIG. 1 is a cross sectional view of a semiconductor package of a first embodiment in accordance with the present invention.

FIG. 1 is a cross sectional view of a semiconductor package of an embodiment in accordance with the present invention.

In FIG. 1, there are provided plural semiconductor chips 10 mounted on an interconnection substrate 20. The interconnection substrate 20 is mounted on a package base 80. The interconnection substrate 20 is provided with an optical device 30 for inputting optical signals to the interconnection substrate 20 or for outputting optical signals from the interconnection substrate 20.

In addition to the interconnection substrate 20, the package base 80 is also provided with an optical transmission medium 40 for transmitting optical signals from the optical device 30, and provided with a receptacle 50 for making optical connection between the optical transmission medium 40 and an optical fiber connector.

Figure 2:
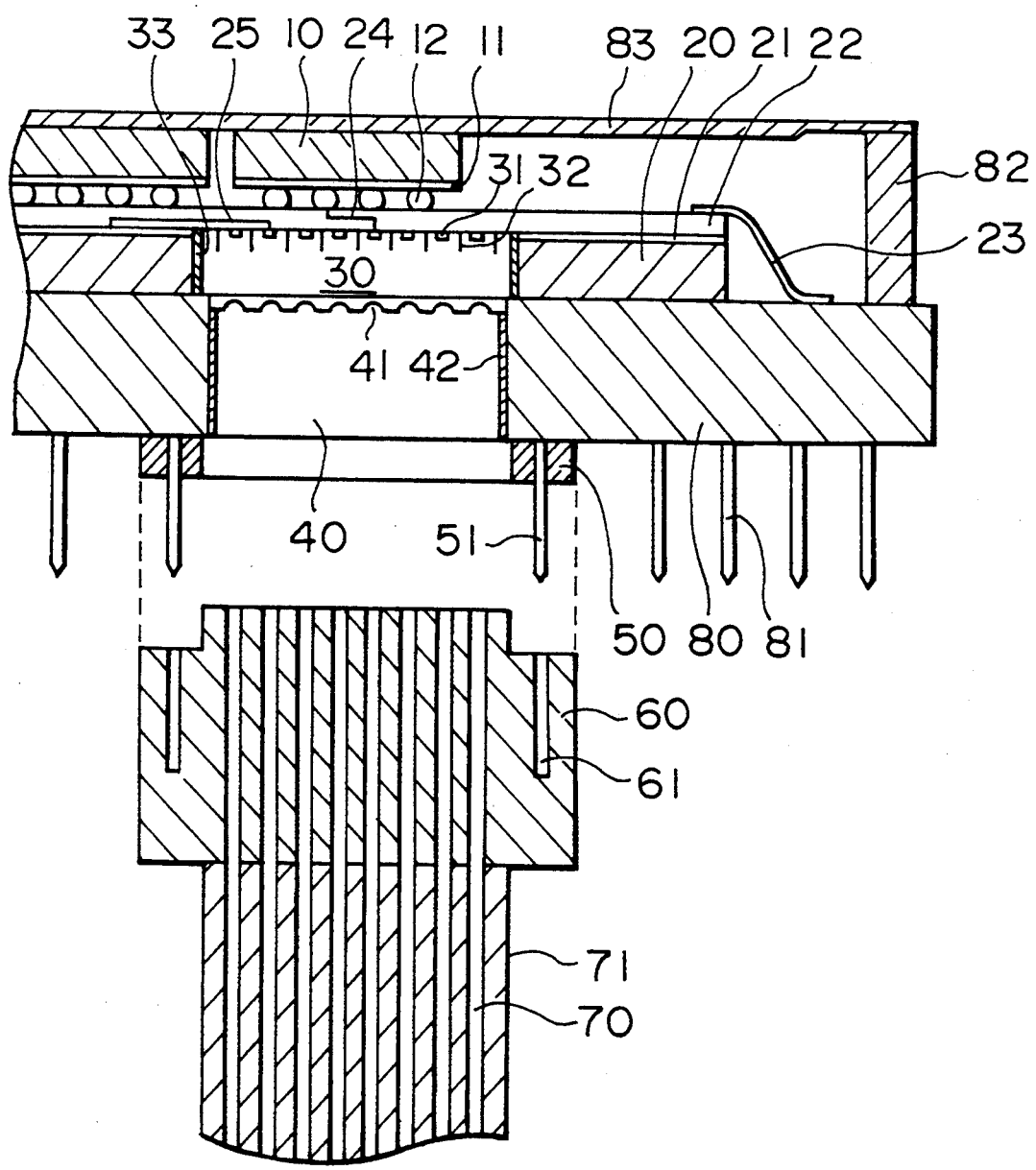
FIG. 2 is a fragmentary cross sectional view of a semiconductor package of the first embodiment in accordance with the present invention.

FIG. 2 is the fragmentary cross sectional view of a semiconductor package shown in FIG. 1. Referring to FIG. 2, component elements of the package according to this embodiment will be described below.

The semiconductor chip 10 is made of silicon. In this specific embodiment, the size of the semiconductor chip 10 is about 2 cm square. An integrated circuit 11 is formed on the semiconductor chip 10. The semiconductor chip 10 is connected to the interconnection substrate 20 by means of solder bumps 12 composed of Pb-Sn based alloy. These solder bumps 12 are arranged with a pitch of 250 $\mu$m.

The interconnection substrate 20 is made of silicon, as is the semiconductor chip 10. In this specific example, the wafer size of the interconnection substrate 20 is about 3 inch square. An integrated circuit 21 is formed on the interconnection substrate 20. The interconnection substrate 20 is also provided with the optical device 30. A multi-wiring layer 22 is commonly formed on the surfaces of both the interconnection substrate 20 and the optical device 30. The multi-wiring layer 22 consists of, for example, a multi-layer structure of Cu/Al/polyimide. The integrated circuit 11 and/or the integrated circuit 21 are electrically connected to the package base 80 by means of the multi-wiring layer 22 and a TAB 23. The integrated circuit 11 and/or the integrated circuit 21 are also electrically connected via interconnection wires 24 and 25 included in the multi-wiring layer 22 to individual light-emitting portions and/or light-detecting portions 31 of the optical device 30. The wire pitch of the TAB 23 is about 100 $\mu$m. The optical device 30 is preferably disposed in a region near the center of the interconnection substrate 20 so as to reduce the interconnection propagation delay time between the integrated circuits 11 and 21 and the optical device 30. The interconnection substrate 20 is fixed to the package base 80 by means of thermoconductive resin so that heat generated by the integrated circuit 21 and optical device 30 can be transferred through the package base 80 to the outside for cooling.

The optical device 30 is made of, for example, InP based semiconductor and the light-emitting/detection portions 31 consist of a surface-emitting laser diode (light-emitting portion) or a p-i-n photodiode (light-detecting portion). In this specific embodiment, the optical device 30 is constructed in an integrated form of a two-dimensional array having an array pitch of 250 $\mu$m, and the oscillating or detecting wavelength of these optical portions is 1.3 $\mu$m. The light-emitting/detection portions 31 are isolated from each other by means of grooves 32 so as to avoid thermal and electrical crosstalk among them.

The optical device 30 is mounted with polyimide resin 33 in a through-hole which is formed by a process such as etching or dicing in the interconnection substrate 20. A transmitter circuit or a receiver circuit for driving the optical device 30 may be formed either on the optical device 30 itself or on the integrated circuits 11 or 21 which are disposed near the optical device 30. In this embodiment, the integrated circuit 11 or 21 and the optical device 30 are connected to each other by means of the multi-wiring layer 22 commonly formed on the surfaces of both the interconnection substrate 20 and optical device 30. Therefore, unlike the case where the optical device 30 is mounted by flip-chip bonding on the interconnection substrate 20, no reduction is brought about in the assembly density of the semiconductor chips 10. Furthermore, compared with the case where electrical connection is made by wire bonding or TAB for the optical device 30 disposed separately from the interconnection substrate 20, finer and more complicated connection can be achieved.

The package base 80 consists of mullite ceramic multilayer wiring substrate. The size of the substrate, in this specific embodiment, is about 3.5 inch square. The package base 80 is provided with the optical transmission medium 40, receptacle 50, and input/output pins 81. TAB 23 and the interconnections inside the package base 80 provide means for connection to the input/output pins 81 disposed on the bottom face of the package base 80. The input/output pins 81 are arranged in the form of a centered lattice arrangement with a pitch of 2 mm.

The optical transmission medium 40 is made of, for example, quartz based glass and it is provided with lenses 41 on its surface for reducing optical coupling loss. These lenses 41 are formed in a two-dimensional array by a process such as thermal diffusion, molding or lithography. The structure or location of the lenses can be modified depending on the optical design. For example, a grating lens or graded-index lens may be used. The array pitch is 250 μm which is the same as that of the optical device 30. By providing the lenses 41 formed on the optical transmission medium 40 in such a way, it is possible to achieve a reduction in the optical coupling loss between the optical device 30 and optical fibers 70, and a reduction in optical crosstalk. If required, further reduction in optical crosstalk can be effectively achieved by providing optical shields between adjacent optical paths.

The above optical transmission medium 40 is fixed with low-melting point glass 42 into a through-hole formed earlier in the package base 80, and the through-hole is also sealed with the low-melting point glass. This optical transmission medium 40 fixed with the low-melting point glass 42 to the package base 80 leads to great advantages such as capability of easier sealing compared with the case where the optical fibers are directly fixed to the package base 80, removability of the optical fibers 70 from the package base 80, and capability of easily treating the package after fixing and sealing are carried out.

The receptacle 50 is made of high precision molded resin and provided with connector pins 51. The receptacle 50 is fixed to the package base 80 by, for example, resin having strong adhesion.

Furthermore, the package base 80 is provided with a frame 82 and also a lid 83 on the upper face of the package base 80 for protecting the interconnection substrate 20 and the semiconductor chip 10 from the external ambience. The frame 82 and the lid 83 are made of, for example, Kovar alloy. The frame 82 is fixed with hard-solder on the upper face of the package base 80 in its peripheral region. The package is sealed with the lid 83 fixed on the frame 82 by seam welding. In order to release the heat generated in the semiconductor chip 10, the lid 83 also has contact with the semiconductor chips 10 via solder with high thermal conductivity.

There is also provided an optical fiber connector 60 through which input and output optical signals are given to or from the semiconductor package described above. The optical fiber connector 60 is made of high precision molded resin and has guide holes 61 at the locations corresponding to the connector pins 51 which are to be fitted into these guide holes. Optical connection is achieved between the optical device 30 and the optical fibers 70 by connecting the optical fiber connector 60 to the receptacle 50. The insertion direction of the connector pins 51 is the same as that of the input/output pins 81. In this specific embodiment, the optical fibers 70 are made of quartz based glass with a diameter of 125 μm, and these are suitable for the 1.3 μm wavelength band. These optical fibers 70 are bound with resin coating into a bundle to form an optical fiber cable 71. The optical fibers 70 are arranged with a pitch of 250 μm which is the same as that of the optical device 30 and the lenses 41.

Now, the fabrication process of the semiconductor package according to the present embodiment will be briefly described below.

First, semiconductor chips 10 on which integrated circuits 11 are formed, an interconnection substrate 20 on which an integrated circuit 21 is formed, and an optical device 30 are prepared individually by well-known conventional processes. Then, these elements are tested prior to packaging processes. In the case where the integrated circuit 21 is formed together with the optical device 30 monolithically on the interconnection substrate 20, good compatibility is required between the processes for the integrated circuit 21 and the optical device 30, which is very difficult to achieve. Even if the monolithic integration is achieved, the optical device 30 is often degraded due to the difference in lattice constant between silicon and compound semiconductor. In contrast, in the present embodiment, a suitable fabrication process can be selected for each of the optical device 30 and the integrated circuit 21, and high reliability can be achieved.

Next, a through-hole is formed by an etching process or by dicing in the interconnection substrate 20. Then, the optical device 30 is fixed into this through-hole. Furthermore, an interconnection layer 22 is formed on the surface of the interconnection substrate 20 and on the surface of the optical device 30. Thereafter, testing is carried out with a wafer prober. Then the semiconductor chips 10 are connected with solder bumps 12 by flip-chip bonding onto the interconnection layer 22, and TAB 23 is also connected to the interconnection layer 22. Then, testing is carried out via the TAB 23 for the chips 10, interconnection substrate 20, and optical device 30.

Prior to the following steps, an optical transmission medium 40 is fixed into a through-hole formed in a package base 80 with tight sealing between the medium 40 and the package base 80.

While electrical power is supplied via the TAB 23 to the interconnection substrate 20 so as to drive the optical device 30, positioning is carried out between the optical device 30 and a lens 41, and then the interconnection substrate 20 is fixed to the package base 80. Thereafter, the TAB 23 is connected to the package base 80. Then, electrical power is supplied via input/output pins 81 to evaluate the optical coupling loss between the optical device 30 and the lenses 41, the optical input-output characteristics and the like. After positioning is carried out with respect to the optical transmission medium 40, a receptacle 50 is fixed to the package base 80. Then, an optical fiber connector 60 is connected to the receptacle 50 and the optical coupling loss between the optical device 30 and the optical fibers 70 is evaluated.

Now, in an atmosphere of dry $N_2$ gas, the semiconductor chips 10 are fixed to a lid 83, and then the lid 83 is connected, for example, by seam welding to a frame 82 so as to seal the package. Finally, the optical fiber connector 60 is connected and electrical power is supplied via the input/output pins 81 to evaluate the package with regard to electrical input-output characteristics, optical input-output characteristics, reliability, and the like..

In accordance with the present embodiment, optical connection can be achieved between the optical device 30 and the optical fibers 70 existing outside the package via the optical transmission medium 40 and via the optical fiber connector 60 mounted on or connected to the package base 80. This means that electrical signals can be transmitted to or received from the integrated circuits 11 and 21 by means of the optical signals via the optical interconnection passing through the package base 80. When the optical interconnection consists of 4×4 array units each of which consists of a 25×25 two-dimensional array, about 10,000 channels are available for signal inputs and outputs per 1 inch square of the package base. In contrast, in the case of a conventional semiconductor package with no optical interconnection, the maximum available number of the inputs-/outputs achieved by the TAB 23 or input/output pins 81 is about 3,000 to 4,000.

As will be seen from the above discussion, the present invention can provide a semiconductor package in which extremely higher density interconnection is realized compared with the conventional packages. Thus, it is possible to achieve an increase in the number of inputs/outputs for semiconductor packages. Furthermore, compared with the conventional electrical interconnection using the TAB 23 or input/output pins 81, the optical interconnection has an advantage that it can transmit signals with a wider band at a higher speed without interference. When laser diodes and photodiodes are used as in the present specific embodiment, high speed signal input/output of the order of GHz or above can be achieved.

Another advantage of the present invention is that because the optical connector receptable is disposed on the bottom face of the semiconductor package, the insertion direction of the connector pins 51 can be made the same as that of the input/output pins 81, and thus the package can be easily mounted on a circuit board. Besides, no additional space is required around the semiconductor package for installation of optical fibers and, thus, no reduction occurs in the assembly density of the semiconductor packages mounted on a circuit board.

Still another advantage is that because both the optical interconnection and the electrical input/output pins are available for inputting and/or outputting signals through the package base 80, suitable connection can be selected from electrical and optical means, depending on the specification of input and/or output. For example, optical input/output may be selected for high speed interconnection, while electrical input/output pins 81 may be selected for electric power supply.

In the present specific embodiment, laser diodes and photodiodes are used as optical devices. However, it is possible to use other devices: for example, optical logic devices such as an optical bistable device and an optical thyristor, or optoelectronic integrated circuits in which a transmitter circuit or a receiver circuit for driving optical devices, a signal multiplexer, and/or other circuits are included.

Furthermore, in the present embodiment, the optical device is embedded and fixed in the through-hole formed in the interconnection substrate. However, the optical device may be also fixed in a recess formed in the interconnection substrate, rather than in a through-hole. In this case, it is needed to select a suitable wavelength of optical device so that light can pass through the interconnection substrate and adhesive material.

Furthermore, a pin-connected type optical fiber connector is used in the present embodiment. However, screwed type or plug-in type optical fiber connectors may be also used. As a matter of course, it is also possible to use an assembly including both the optical fiber connector and optical transmission medium in an integrated form.

Figure 3:
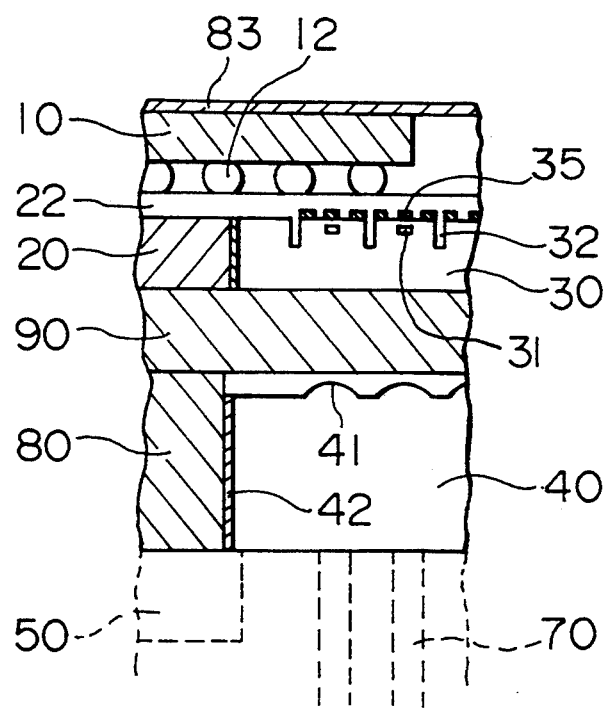
FIG. 3 is a fragmentary cross sectional view of a semiconductor package of a second embodiment in accordance with the present invention.

FIG. 3 is a fragmentary cross sectional view of a semiconductor package of a second embodiment in accordance with the present invention.

The semiconductor package shown in FIG. 3 is similar to the preceding embodiment, but an optical device 30 and an interconnection substrate 20 are disposed on a supporting substrate 90 formed on a package base 80.

The optical device 30 has planar electrodes 35 which are connected to an interconnection layer 22, and both p-type and n-type electrodes are formed on the side of the interconnection layer 22. The supporting substrate 90 is made of silicon which is transparent to light with wavelength of 1.3 $\mu$m to which the optical device 30 is adapted. This substrate 90 of silicon has a thermal conductivity twice as high as that of InP which is a semiconductor material composing the optical device 30. The optical device 30 and the interconnection substrate 20 are attached to the supporting substrate 90 with a thin and transparent adhesive. The supporting substrate 90 is attached to the package base 80 with thermo-conductive resin.

In the present embodiment, the supporting substrate 90 acts as a heat sink for the optical device 30, and the generated heat is released via the supporting substrate 90. As a result, compared with the case where the supporting substrate is not used, it is possible to reduce the difference in temperature between the central portion and the peripheral portion of the optical device 30. It is also possible to reduce the variation in characteristics of optical devices 30 due to heating. Furthermore, thermal crosstalk can also be reduced. Light emitted from the optical device 30 or light incident to the optical device 30 can pass through the supporting substrate 90, so that the supporting substrate 90 does not cause obstruction to optical input/output signals. The supporting substrate 90 leads to stronger adhesion to the optical device 30 and the interconnection substrate 20 and, moreover, it gives less concentration of stress at the connecting interface between the optical device 30 and the interconnection substrate 20. Both the interconnection substrate 20 and supporting substrate 90 are made of silicon and, thus, have the same thermal expansion coefficient. Therefore, there occurs no reduction in reliability due to the thermal stress.

Light from light-emitting portions 31 diverges because of diffraction. When the refractivity of the optical device 30, the distance between the light-emitting portion 31 and the supporting substrate 90, the emitting-light wavelength, the spot size of the light-emitting portion 31, the refractivity of the supporting substrate 90, and the thickness of the supporting substrate 90 are given by $n_1$, $t_1$, $\lambda$, $\omega$, $n_2$, and $t_2$, respectively, the spot size $\omega'$ of light beam at the interface between the supporting substrate 90 and the package base 80 is given approximately by $(\lambda/\pi\omega)\cdot(t_1/n_1+t_2/n_2)$. For example, in this specific embodiment, if it is assumed that $n_1=3.2$, $t_1=400$ $\mu$m, $\lambda=1.3$ $\mu$m, $\omega=1$ $\mu$m, $n_2=3.5$, $t_2=500$ $\mu$m, the spot size $\omega'$ is about 110 $\mu$m.

In this embodiment, if the lenses 41 have an effective aperture D of 230 μm and if the condition that D≧2ω' is satisfied, then the light emitted from the light-emitting portion 31 can be effectively incident to the lenses 41. Furthermore, if the array pitch p of the light-emitting portion 31 is 250 μm and if the condition that p≧2ω' is satisfied, then crosstalk does not occur between each optical signal emitted from the light-emitting portion 31. The above description discusses only the light-emitting portion. However, the light-detection portion also has a similar effect.

In this specific embodiment, when light is incident to the lenses 41, the light is coupled to the optical fibers 70 whose core diameter is 50 μm by means of the lenses 41, which have a radius of about 170 μm which is formed on the optical transmission medium 40 having a thickness of about 5 mm. Even if misalignment of ±10 μm occurs during assembling of the optical device 30 and the lenses 41, small coupling loss such as 1 dB or less can be obtained after a receptacle 50 is fixed to the package base 80 with an alignment accuracy of about ±10 μm. This means that the present embodiment provides an easy and simple process for assembling modules, which requires only rough alignment.

Figure 4A:
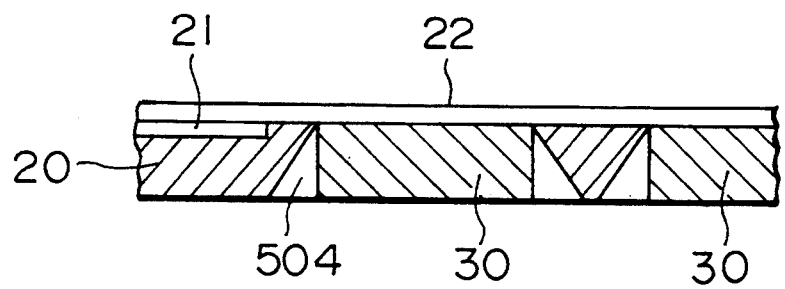
FIG. 4a is a fragmentary cross sectional view showing the structure of a portion where an optical device is mounted on an interconnection substrate.
Figure 4B:
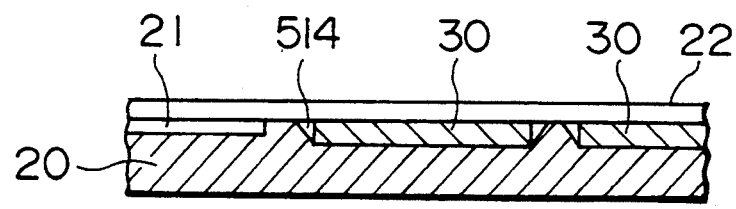
FIG. 4b is a fragmentary cross sectional view showing the structure of a portion where an optical device is mounted on an interconnection substrate.

FIGS. 4a and 4b show an example of means for forming an optical device in or on the interconnection substrate 20.

In the case of FIG. 4a, the interconnection substrate 20 has through-holes 504 in which the optical device 30 is to be fixed with resin or the like. In the case of FIG. 4b, the interconnection substrate 20 has recesses 514 in which the optical device 30 is to be fixed with resin or the like. The through-holes 504 and recesses 514 in the interconnection substrate 20 are formed by anisotropically etching a silicon wafer of (100)-surface orientation in, for example, a KOH solution. The resulting through-holes 504 or recesses 514 have side surfaces of (111)-orientation.

In this way, through-holes or recesses can be formed in the interconnection substrate by anisotropical etching with higher accuracy than in the case of mechanical processing. For example, high accuracy of the order of 1 μm or less can be achieved. Such high forming accuracy leads to high location accuracy of the optical device with respect to the interconnection substrate, thus resulting in high alignment accuracy of the optical device with respect to the optical transmission medium included in the package base.

Figure 5:
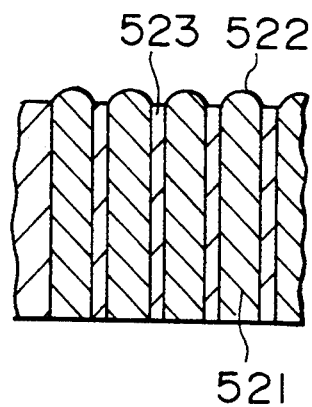
FIG. 5 is a fragmentary cross sectional view of an optical transmission medium according to another embodiment of the present invention.

FIG. 5 is a fragmentary cross sectional view of another example of optical transmission media for use in a semiconductor package in accordance with the present invention.

Unlike the optical transmission medium used in the first and second embodiments, focusing rod type lenses 521 made of glass are used as an optical transmission medium in this embodiment. The rod lenses each have a diameter of 125 μm and have a normalized optical path length of 0.25 mm. By doping impurities from the surface into the rod glass, the refractivity is made to exhibit the distribution in the form of the square of the distance in the radial directions. The refractivity of the central portion is about 1.6. On the end portion of each rod lens 521, a hemi-spherical lens 522 having a curvature radius of about 170 μm is formed by etching in a buffered HF solution, making effective use of the dependence of the etching rate on the impurity concentration. An optical shield material 523 of black glass is filled between the rod lenses 521.

This type of optical transmission medium leads to less optical coupling than in the case of the second embodiment, and also leads to easier capability of alignment between the optical device and the optical transmission medium and between the optical device and the receptacle. For example, even if misalignment of ±10 μm occurs during assembling of the optical device 30 and the rod lens 521, very small coupling loss such as 0.5 dB or less can be obtained after a receptacle 50 is fixed to the package base 80 with alignment accuracy of about ±20 μm. It is also possible to achieve a larger reduction in optical crosstalk by providing optical shields 523 than in the case of the second embodiment.

Figure 6:
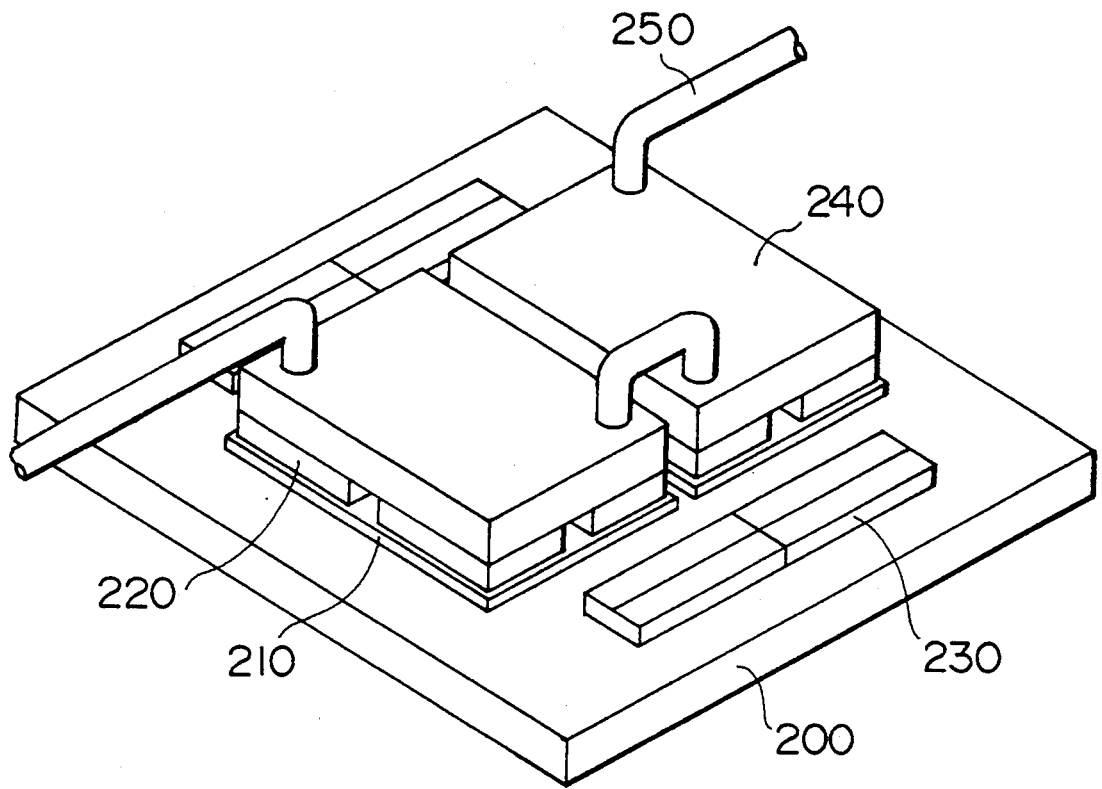
FIG. 6 is a perspective view of a semiconductor module according to an embodiment of the present invention.

FIG. 6 is a perspective view of a semiconductor module comprising a plurality of the above-described semiconductor packages mounted on a circuit board.

In FIG. 6, a plurality of semiconductor packages 220 are mounted on the upper face of a circuit board 200. Each semiconductor package 220 is mounted on the circuit board via a connector disposed in a connector housing 210. A cooling block 240 is provided on the semiconductor packages 220 to cool the semiconductor packages 220 in cooperation with coolant supplied through a cooling pipe 250. An electric co-axial cable connector 230 is also provided for signal input/output to or from the semiconductor module.

Figure 7:
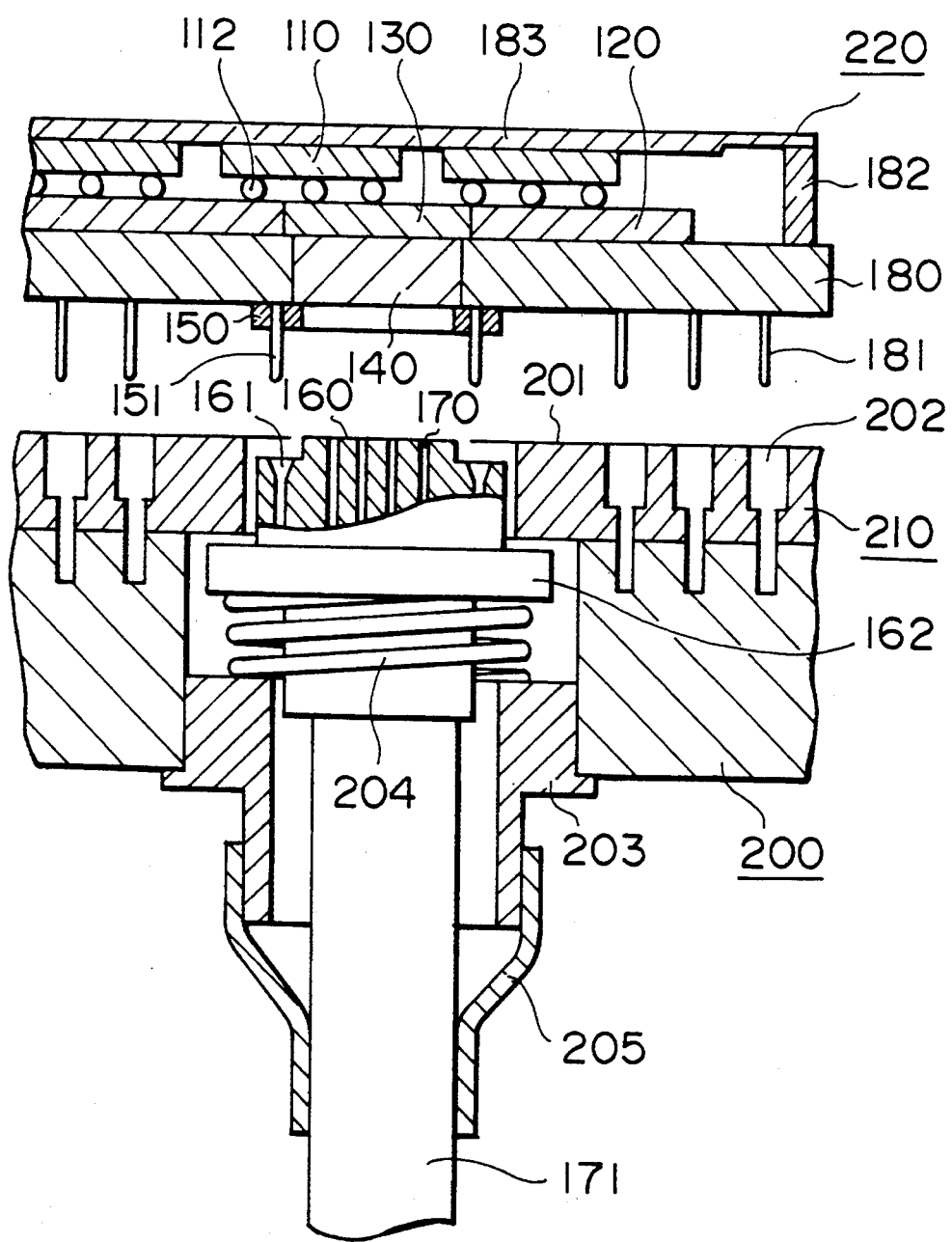
FIG. 7 is a fragmentary cross sectional view of the semiconductor module shown in FIG. 6.

FIG. 7 is a fragmentary cross sectional view of the semiconductor module shown in FIG. 6, showing the detailed structure of connection between each semiconductor package 220 and the circuit board 200.

The semiconductor package 220 includes a semiconductor chip 110, an interconnection substrate 120, and a package base 180. The semiconductor chip 110 is connected to the interconnection substrate 120 via bumps 112. The interconnection substrate 120 is provided with an optical device 130 having an interconnection layer on it, wherein the interconnection layer is commonly formed on both the interconnection substrate 120 and optical device 130. The package base 180, on which the interconnection substrate 120 is to be mounted, has an optical transmission medium 140 disposed at a location corresponding to the optical device 130, and also has input/output pins 181 for inputting and/or outputting electric signals or power. The package base 180 also has a receptacle 150 for connecting an optical fiber connector 160 to the optical transmission medium 140. The semiconductor package 220 is hermetically sealed with a lid 183, a frame 182 and the package base 180.

On the other hand, the circuit board 200 has a connector housing 210 on its surface. The connector housing 210 includes input/output pin connectors 202 into which the input/output pins 181 of the semiconductor package 220 are to be inserted, and also includes an optical fiber connector 160 which is installed in such a way that the optical axis is perpendicular to the circuit board 200 and so that there is a gap on the side wall of the optical fiber connector 160. The input/output pin connectors 202 are arranged in the connector housing 210 and their end portions are connected with solder into through-holes formed in the circuit board 200 so as to make electrical connection with the interconnection on the circuit board 200. On the back surface of the circuit board 200, there is disposed an optical fiber cable 171 connected to the optical fiber connector 160. The circuit board 200 consists of a multilayer printed circuit board, wherein the substrate material of the board is made of resin having low dielectric constant, and low resistance copper interconnections are formed on the substrate. The optical fiber connector 160 is made of high precision molded resin and has guide holes 161 into which connector pins 151 of the receptacle are to be inserted, and also has a flange 162. The guide holes 161 have open ends each widened in a tapered shape. A spring 204 is provided between the flange 162 and a back cap 203. The optical fiber cable 171 is formed of bundled optical fibers 170. The optical fiber cable 171 is inserted into the back cap 203 and fastened with a cover 205 made from a thermal shrinkage tube.

The semiconductor packages 220 are mounted on the circuit board 200 having the optical fiber connector 160 in a manner described above, so that both the electrical and optical input/output become available, which can be used easily in a convenient way. In general, higher accuracy is required for connection of optical fibers than electrical input/output pins. Therefore, if the optical fiber connector 160 is fixed rigidly to the circuit board 200, then the required accuracy cannot be achieved. In order to avoid this problem, the present embodiment provides moderate flexibility by means of a gap between the side wall of the optical fiber connector 160 and the circuit board 200, absorbing the errors which would occur during attachment of the receptacle 150, the input/output pins 181, and the input/output pin connectors 202. Because the guide holes 161 have open ends widened in a tapered shape, the connector pins 151 can be easily inserted into the guide holes 161. When the optical fiber connector 160 is connected to the receptacle 150, the spring 204 acts adequately against insertion pressure. On the other hand, when the optical fiber connector 160 is removed from the receptacle 150, the flange 162 is locked to a supporting element 201. Thus, both the connector pins 151 and the input/output pins 181 can be inserted or removed at the same time. The cover 205 protects the optical fiber cable 171 from being broken adjacent the back cap 203. If the optical fiber cable 171 has been disposed in an earlier step on the back surface of the circuit board 200, a desired optical interconnection will be completed just by attaching the semiconductor packages on the circuit board 200.

In this specific embodiment, one optical fiber connector is provided for each optical device. However, it is also possible to provide an optical fiber connector which connects a plurality of optical fiber cables in a group to a plurality of optical devices. In order to achieve a further reduction in the size of the optical fiber connector, the array pitches of the optical devices or optical fibers may be reduced and finer optical fibers may be used. A guide means may be provided on the back surface of the circuit board for laying the optical fiber cable with desired length and a desired curvature radius. Furthermore, lock means and spring means may be achieved by mechanisms similar to those described above.

Now, another embodiment will be described in which the semiconductor module shown in FIG. 6 is applied to a multi-processor system.

Figure 8:
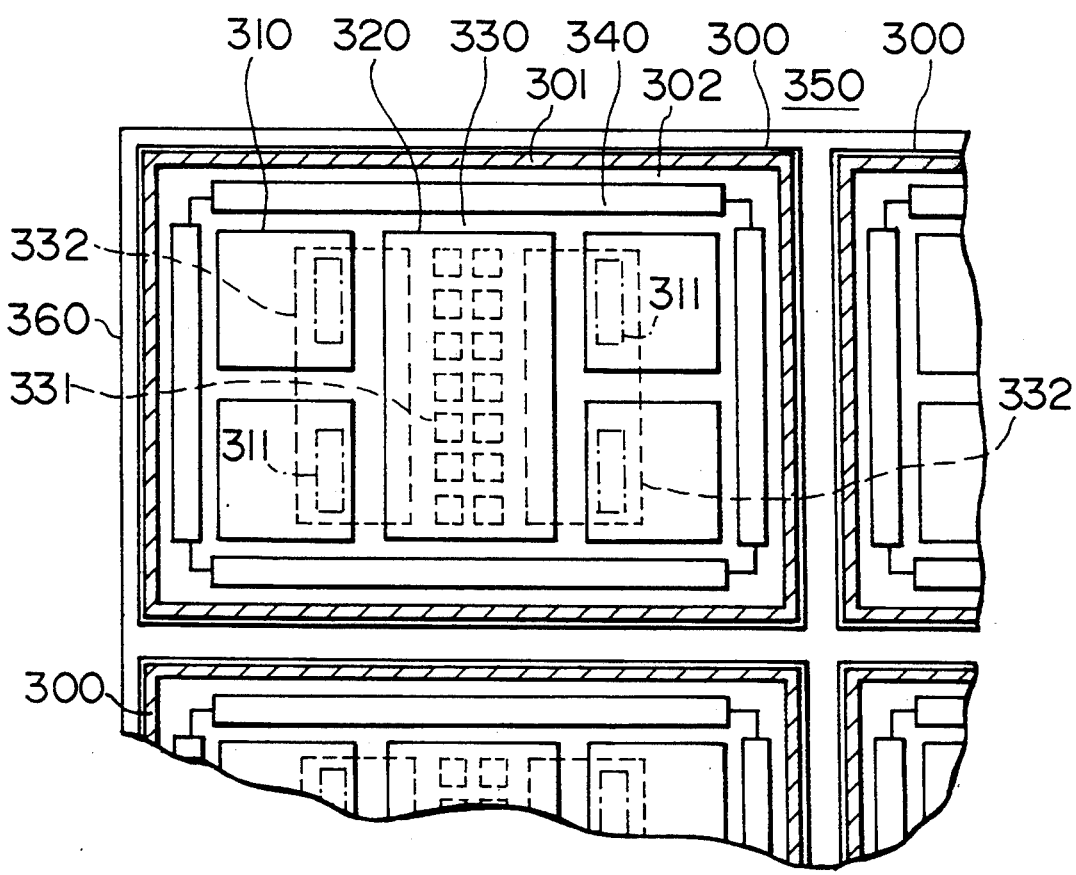
FIG. 8 is a fragmentary top plan view of a semiconductor module constituting a multiprocessor system.

FIG. 8 is a fragmentary top plan view of the semiconductor module constituting a multi-processor system. In FIG. 8, the lid and cooling block on the semiconductor package are not shown for convenience of illustration.

In FIG. 8, a plurality of semiconductor packages 300 are mounted on a circuit board 350 via a connector housing 360 and interconnection or power is provided for these semiconductor packages 300. Inside the frame 301 of the semiconductor package 300, there are provided four semiconductor chips 310 on each of which an instruction processor circuit with a high speed buffer memory 311 is formed, and a semiconductor chip 320 on which a system control circuit is formed, wherein these chips are connected via bumps to an interconnections substrate 330 made of silicon. Each of these chips is connected to each other by means of interconnection formed on the interconnection substrate 330.

Optical devices 331 are embedded in the interconnection substrate 330 at positions just below the system control circuit semiconductor chip 320. In regions around the optical devices 331, there are formed work memory circuits 332 on the interconnection substrate 330. A multilayer interconnection is formed on the surface of the interconnection substrate 330 and this interconnection is connected via TAB 340 to a package base 302. The package base 302 is provided with input/output pins, optical transmission media, and receptacles in a manner described above. On the back surface of the circuit board 350, there are provided optical fiber connectors and optical fiber cables at locations corresponding to the optical devices 331, and a plurality of semiconductor packages 300 are connected to each other via the optical fiber cables.

Each optical device 331 is composed of a two-dimensional array of surface-emitting laser diodes or photodiodes. The interconnection substrate 330 has seven 25×25 arrays of laser diodes and seven 25×25 arrays of photodiodes. These laser diode arrays and photodiode arrays are respectively connected to photodiode arrays and laser diode arrays of another semiconductor package via 25×25-core optical fiber cables. Each optical fiber cable or optical transmission medium has the same optical length as that of the other optical fiber cables or optical transmission media, and thus the skew in propagation time of optical signals is in a required range predetermined for a circuit clock. Laser diodes and photodiodes are arranged alternately so as to diffuse the heat generated by the laser diodes.

Figure 9:
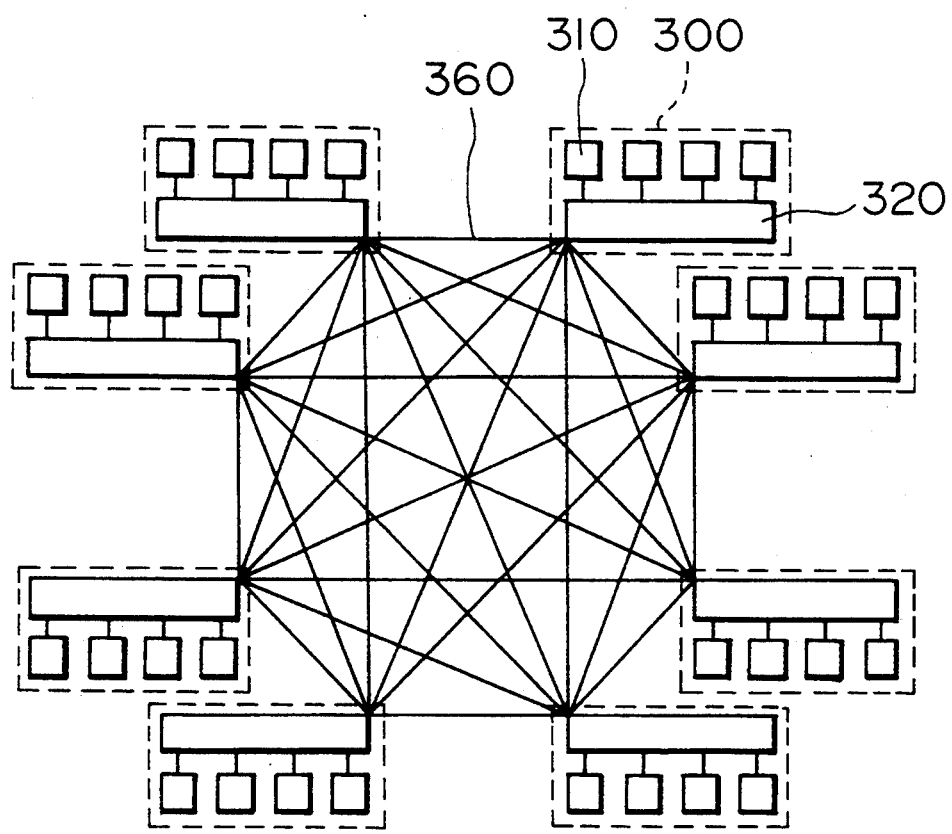
FIG. 9 is a schematic representation showing interconnections among semiconductor packages in the semiconductor module shown in FIG. 8.

FIG. 9 is a schematic representation showing an interconnection network arranged in the semiconductor module shown in FIG. 8, whereby for example eight semiconductor packages 300 mounted on a circuit board 350 are connected to each other. The semiconductor chips 320 included in respective semiconductor packages are connected to each other via two sets of optical fiber cables 360 consisting of an optical fiber for transmission and one for reception. Thus, a 32-processor system is constructed with a 72 byte perfect connection network. The total number of the interconnections between semiconductor packages 300 is 70,000. The maximum distance between the semiconductor packages 300 is a few tens of cm. Thus, when the refractivity of the optical fiber cable 360 is 1.5, an interconnection delay time of about 1 nsec can be achieved between system control circuits. This delay time is considerably small compared with conventional electric interconnections. Such an optical fiber network can be also effectively used for a system whose machine cycle time is in the order of 1 nsec or less.

As described above, a semiconductor module in accordance with the present invention can be used to construct a perfect connection network for use in a tightly coupled multiprocessor system, which cannot be realized by the conventional technology because of the bottleneck with regard to input/output pins. The perfect connection network is most ideal for improving performance of multiprocessor systems. Optical interconnections lead to a reduction in delay of transmission between processors. Furthermore, unlike the electrical interconnection technology in which degradation occurs in signal waveforms due to interconnection capacitance, such degradation does not occur in the case of optical interconnections. Optical interconnection technology has also an advantage that it is free from ground noise and free from crosstalk.

In this embodiment, optimization is carried out in the distribution of various kinds of functional circuits or devices among semiconductor chips and interconnection substrates. For example, an optical device is located near a system control circuit so as to reduce the interconnection delay time.

In the embodiment shown in FIGS. 8 and 9, a perfect connection network is constructed. However, another type of connection network may also be configured. For example, by using an optical-fiber coupler which couples one optical device to a plurality of optical devices, a reduction in the number of optical fibers can be achieved. In the present embodiment, optical interconnections are used to make connection between tightly coupled multiprocessors. However, as a matter of course, optical interconnections can be also applied to the connections for main memory circuits, extended memory circuits, input/output processor circuits, loosely coupled multiprocessors, and the like. It is also apparent that, in addition to multiprocessors, the present invention may be also effectively used for super parallel processors or a large scale of exchange in which an ultra high density of interconnection is needed between semiconductor packages.

As known well, semiconductor packages or semiconductor modules can be achieved in various forms. The present invention may be effectively embodied, adapting to each of such forms.

In accordance with the present invention, as described above, a high density and high speed optical interconnection can be achieved quite effectively in practical use for semiconductor packages having semiconductor chips and interconnection substrates by which the semiconductor chips are connected, or for semiconductor modules having a circuit board by which the semiconductor packages are connected, whereby an improvement can be achieved in performance of semiconductor packages and semiconductor modules.

Especially in a large scale information system which includes high speed and high density integration semiconductor packages, a huge number of interconnections are required. Thus, it is apparent that the present invention provides a significant advantages for such systems, in particular.

What is claimed is:

1. A semiconductor package comprising:
    a semiconductor chip;
    an interconnection substrate having a surface to which said semiconductor chip is flip-chip bonded;
    an optical device at least partially embedded in a portion of said interconnection substrate to input and/or output optical signals via another surface of said interconnection substrate perpendicularly thereto;
    a package base having a surface on which said interconnection substrate is mounted, and provided with an optical transmission medium disposed in the thickness of the package base at a location corresponding to said optical device; and
    a receptacle disposed on another surface of said package base so as to be pluggable with an optical fiber cable connector plugged into the receptacle to thereby make an optical coupling between said optical device and said optical fiber cable connector via said optical transmission medium.

2. A semiconductor package as defined in claim 1, wherein said optical device is embedded in one of a through-hole and a recess formed in said interconnection substrate.

3. A semiconductor package as defined in claim 1, wherein said interconnection substrate has an interconnection layer which connects circuits formed on said interconnection substrate or on said semiconductor chip to said optical device.

4. A semiconductor package as defined in claim 1, wherein said optical device is disposed adjacent said semiconductor chip.

5. A semiconductor package as defined in claim 1, wherein said optical transmission medium has a lens or an optical waveguide optically coupled with said optical device.

6. A semiconductor package as defined in claim 1, wherein a supporting substrate is provided between said interconnection substrate and said package base.

7. A semiconductor package as defined in claim 6, wherein said supporting substrate is made of a material which is transparent with respect to a wavelength of light emitted from or incident to said optical device and has high thermal conductivity.

8. A semiconductor package as defined in claim 7, wherein a lens is provided adjacent an interface between said package base and said supporting substrate; and said lens, said optical device and said supporting substrate are formed and arranged to satisfy the condition given by:

$$\pi D\omega/2\lambda \geq t_1/n_1 + t_2/n_2$$

where $n_1$ is the refractivity of said optical device, $t_1$ is a distance from a light-emitting portion or light-detection portion to said supporting substrate, $\omega$ is a spot size of said light-emitting portion or light-detecting portion, $\lambda$ is a wavelength of light emitted from or incident to said optical device, $n_2$ and $t_2$ are the refractivity and thickness, respectively, of said supporting substrate, and D is an aperture of said lens.

9. A semiconductor package as defined in claim 7, wherein said optical device has an array comprising a plurality of light-emitting portions or light-detection portions, and said optical device and said supporting substrate are formed and arranged to satisfy the condition given by:

$$\pi p\omega/2\lambda \geq t_1/n_1 + t_2/n_2$$

where $n_1$ is the refractivity of said optical device, $t_1$ is a distance from said light-emitting portion or light-detection portion to said supporting substrate, $\lambda$ is a wavelength of light emitted from or incident to said optical device, $\omega$ is a spot size of said light-emitting portion or light-detection portion, p is an array pitch of said light-emitting portion or light-detection portion, and $n_2$ and $t_2$ are the refractivity and thickness of said supporting substrate, respectively.

10. A semiconductor module comprising:

a semiconductor chip;

an interconnection substrate having a surface to which said semiconductor chip is flip-chip bonded;

an optical device at least partially embedded in a portion of said interconnection substrate to input and/or output optical signals via another surface of said interconnection substrate perpendicularly thereto;

a package base having a first surface on which said interconnection substrate is mounted, an optical transmission medium being provided in the thickness of said package base at a location corresponding to said optical device, input/output pins being provided on a second surface of said package base so that electrical signals are input/output to/from said interconnection substrate via said input/output pins;

a receptacle disposed on the second surface of said package base so as to be pluggable with an optical fiber cable plugged into the receptacle to thereby make an optical coupling between said optical device and said optical fiber cable via said optical transmission medium; and a circuit board having a first surface on which said package base is mounted, said optical fiber cable being disposed on a second surface of said circuit board, input/output pin connectors for receiving said input/output pins being provided on the first surface of said circuit board, and an optical fiber connector for connecting said optical fiber cable to said receptacle being provided on the first surface of said circuit board.

11. A semiconductor module as defined in claim 10, wherein said receptacle has connector pins which are inserted into guide holes formed in said optical fiber connector, and said connector pins are constructed such that said connector pins are inserted into said guide holes at the same time when said input/output pins are inserted into said input/output pin connectors.

12. A semiconductor module as defined in claim 11, wherein said guide holes have openings widened in a tapered shape.

13. A semiconductor module as defined in claim 10, wherein said circuit board comprises:

a spring mechanism which holds said optical fiber connector against a force generated when said optical fiber connector is connected to said receptacle; and a lock mechanism which holds said optical fiber connector against a force generated when said optical fiber connector is removed from said receptacle.

14. A semiconductor module including a plurality of semiconductor packages mounted on a circuit board, each of said semiconductor packages comprising:

a plurality of integrated circuit chips forming an instruction processor circuit or a system control circuit;

an interconnection substrate to which said plurality of integrated circuit chips are flip-chip bonded;

an optical device at least partially embedded in a portion of said interconnection substrate, said optical device being connected via interconnections formed on said interconnection substrate to said integrated circuit chips or to a circuit formed on said interconnection substrate;

a package base supporting said interconnection substrate mounted thereon, and having an optical transmission medium disposed in the thickness of said package base at a location corresponding to said optical device and input/output pins provided such that electric signals are input/output to/from said interconnection substrate via said input/output pins; and a receptacle disposed on said package base so as to be pluggable with an optical fiber cable plugged into the receptacle to thereby make an optical coupling between said optical device and said optical fiber cable via said optical transmission medium, wherein said circuit board has input/output pin connectors corresponding to respective semiconductor packages, said input/output pins being inserted into said input/output pin connectors, and an optical fiber connector which connects said optical fiber cable to said receptacle, and said semiconductor packages are connected to each other via optical fiber cables laid on the back surface of said circuit board.

15. A semiconductor module as defined in claim 14, wherein said optical device has a plurality of light emitting elements and a plurality of light detecting elements, and each of said light emitting elements is connected to an associated light detecting element via an optical transmission medium and an optical fiber such that every optical connection has substantially the same optical length.

* * * * *